United States Patent [19]
Zingg

[11] Patent Number: 4,618,798
[45] Date of Patent: Oct. 21, 1986

[54] RESONATOR VIBRATING IN A THICKNESS-SHEAR MODE

[75] Inventor: Walter Zingg, La Neuveville, Switzerland

[73] Assignee: Asulab A.S., Bienne, Switzerland

[21] Appl. No.: 706,830

[22] Filed: Feb. 28, 1985

[30] Foreign Application Priority Data

Apr. 6, 1984 [CH] Switzerland ............... 1743/84

[51] Int. Cl.$^4$ ............................................. H01L 41/08
[52] U.S. Cl. ..................................... 310/366; 310/320; 310/368
[58] Field of Search .................. 310/320, 361, 365–368

[56] References Cited

U.S. PATENT DOCUMENTS

| | | | |
|---|---|---|---|
| 2,635,199 | 4/1953 | Wolfskill | 310/365 |
| 4,149,102 | 4/1979 | Kellen | 310/320 |
| 4,184,095 | 1/1980 | Stacchiotti et al. | 310/366 |
| 4,350,918 | 9/1982 | Sato | 310/320 X |
| 4,379,244 | 4/1983 | Dinger | 310/366 X |
| 4,443,728 | 4/1984 | Kudo | 310/320 X |

FOREIGN PATENT DOCUMENTS

| | | | |
|---|---|---|---|
| 99604 | 7/1982 | European Pat. Off. | |
| 2616878 | 4/1976 | Fed. Rep. of Germany | 310/365 |
| 2939844 | 7/1980 | Fed. Rep. of Germany | |
| 3220032 | 5/1982 | Fed. Rep. of Germany | |
| 0053689 | 4/1977 | Japan | 310/320 |
| 0010016 | 1/1984 | Japan | 310/365 |
| 2020898 | 4/1978 | United Kingdom | |

*Primary Examiner*—Mark O. Budd
*Attorney, Agent, or Firm*—Pollock, Vande Sande & Priddy

[57] ABSTRACT

A resonator (1) is described for vibrating in a thickness-shear mode and has auxiliary electrodes (7f, 8d) between the zone of its main excitation electrodes (3, 4) and the zone of its connection terminals (5, 6) to generate an auxiliary vibration in opposition of phase with respect to the main vibration.

The presence of the auxiliary electrodes (7f, 8d) improves notably the quality factor of the resonator.

8 Claims, 1 Drawing Figure

RESONATOR VIBRATING IN A THICKNESS-SHEAR MODE

BACKGROUND OF THE INVENTION

1. Field of the Invention

This invention relates to a resonator adapted to vibrate in a thickness-shear mode, of the kind comprising a plate of piezo-electric material and plate vibrating means that include a first electrode on a first surface of the plate, a second electrode on the second surface of the plate opposite the first electrode, means for fastening the resonator mechanically to a support and means for connecting the electrodes electrically to an oscillator circuit including terminals on said plate and conductors connected to said terminals and to said electrodes.

A resonator of this type, of which several forms of embodiment are described in e.g. U.S. Pat. No. 4,071,797, is usually associated with an appropriate electronic circuit to form an oscillator which provides an alternating signal having a very stable frequency. Oscillator circuits of this type are used, e.g., in electronic timepieces for which they act as a time base.

The vibration of a resonator of this type is generated by the alternating electric field created between its excitation electrodes by a voltage, also alternating, applied to the electrodes by the electronic circuit to which they are connected.

The mechanical energy necessary for maintaining this vibration is of course delivered, in the form of electric energy, by the electric supply source of the circuit.

If this mechanical energy were confined to the zone of the resonator located between the excitation electrodes, the quantity of electric energy that the supply source would have to deliver to maintain the vibration would be minimal.

However, part of the mechanical energy generated in the zone located between the electrodes leaves this zone. The remainder of the resonator therefore also vibrates, with an amplitude which decreases exponentially away from this zone. The mechanical energy associated with this vibration decreases of course in the same manner.

If the dimensions of this resonator are large enough for the amplitude of this vibration to be virtually nil in the zone where the resonator is fastened to its support due to its exponential decrease, the mechanical energy associated with this vibration is also virtually nil in the latter zone.

If, on the contrary, the dimensions of the resonator are relatively small, the amplitude of this vibration and the mechanical energy associated with it are not nil in the zone where the resonator is fastened. This mechanical energy is dissipated wastefully in the fastening, thus causing a decrease in the quality factor of the resonator.

2. Prior Art

The current trend being to make resonators of the smallest possible size, many proposals have been made for decreasing the amplitude of the vibration of the plate in the zone where it is fastened and thus the quantity of energy dissipated wastefully into the fastening, in order to produce resonators having a good quality factor in spite of their small size.

U.S. Pat. No. 4,124,809, for example, suggests making the ends of the resonator thinner outside the zone where the excitation electrodes are located.

The actual production of such a resonator however, is complicated in practice, and it cannot be mass-produced at low cost.

SUMMARY OF THE INVENTION

An object of the invention is to provide a piezo-electric resonator of the kind described above in which vibration energy loss is highly reduced and which thus has a high quality factor even when its dimensions are small, and yet remains easy to produce, at low cost.

According to the invention, there is provided a resonator of the kind set forth, further comprising means for decreasing the amplitude of the vibration of the plate in the zone of said mechanical fastening means including third electrode connected electrically to the first electrode and located on the second surface of the plate between the second electrode and the mechanical fastening means and a fourth electrode connected electrically to the second electrode and located opposite the third electrode on the first surface of the plate, said third and fourth electrodes being intended to generate an auxiliary vibration of said plate in opposition of phase with respect to the vibration generated by said first and second electrodes.

BRIEF DESCRIPTION OF THE DRAWINGS

The accompanying single FIGURE is a plan view of one form of embodiment of the resonator according to the invention.

Resonator 1 shown in the FIGURE has a quartz plate 2 adapted to vibrate predominantly in a thickness-shear mode. The cuts used for this mode of vibration, such as the AT and BT cuts, are known and will not be described here.

Figure 1:
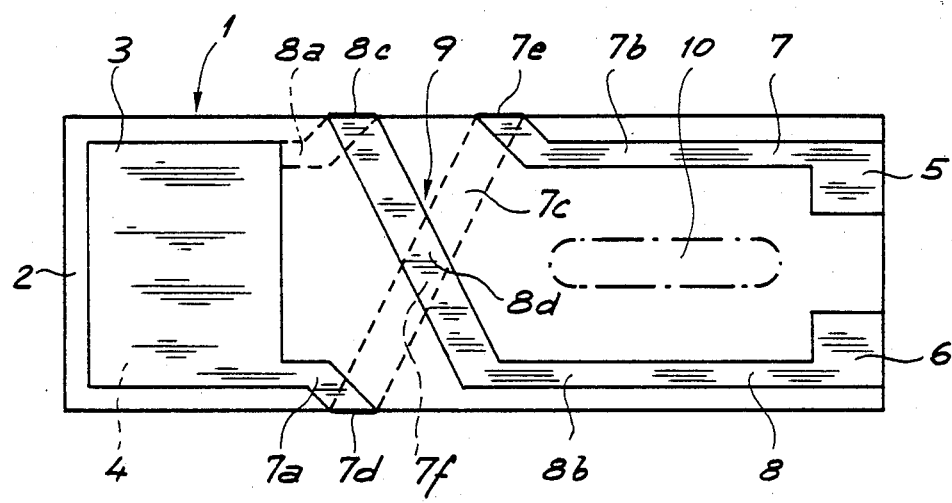

Plate 2 has the overall shape of an oblong right-angled parallelipiped of which only one principal surface is visible in the FIGURE. The thickness of plate 2 determines, also in a known manner, the vibration frequency of resonator 1.

In reference to the positioning of resonator 1 in the FIGURE, the principal surfaces of plate 2 are referred to, respectively, as the upper and lower surfaces in the following description.

Two electrodes 3 and 4, for exciting the vibration of resonator 1, lie opposite each other, respectively on the upper and lower surfaces of plate 2.

Electrodes 3 and 4 are linked to connection terminals 5 and 6 of resonator 1, by conductors 7 and 8. Terminals 5 and 6 serve electrically to connect electrodes 3 and 4 to an oscillator circuit not shown. They are usually also used to fasten mechanically resonator 1 to a support, also not shown.

In the example shown in the FIGURE, terminals 5 and 6 are located on the upper surface of plate 2 to facilitate the fitting and connection of resonator 1 to its support.

Conductor 7 which connects terminal 5 to electrode 3 includes two segments 7a and 7b connected respectively to electrode 3 and to terminal 5 and thus both located on the upper surface of plate 2. Conductor 7 further includes a segment 7c located on the lower surface of plate 2 and connected to segments 7a and 7b by conductors 7d and 7e respectively fitted to the lateral surfaces of plate 2.

Conductor 8 which connects terminal 6 to electrode 4 includes two segments 8a and 8b connected respectively to electrode 4 and to terminal 6 and thus located respectively on the lower surface and on the upper surface of plate 2. Segments 8a and 8b are connected by a conductor 8c fitted to one lateral surface of plate 2.

Conductors 7 and 8 are so arranged that their segments 7c and 8b cross each other, when viewing resonator 1 from above as in the FIGURE, in a zone 9 disposed between electrodes 3 and 4 and terminals 5 and 6. The parts of segments 7c and 8b located opposite each other and defining zone 9 will be referred to from here on as auxiliary electrodes 7f and 8d. The reason for this will become apparent later. In order to distinguish them from auxiliary electrodes 7f and 8d, electrodes 3 and 4 will henceforth be referred to as main electrodes.

When resonator 1 is vibrating, i.e. when its terminals 5 and 6 are connected to a suitable oscillator circuit, auxiliary electrodes 7f and 8d have of course the same voltage as main electrodes 3 and 4. Auxiliary electrodes 7f and 8d thus subject plate 2, in zone 9, to an electric field similar to that produced by main electrodes 3 and 4. This field thus also generates a vibration in a thickness-shear mode in zone 9, this vibration being from now on referred to as auxiliary vibration.

The frequency of the voltage applied to auxiliary electrodes 7f and 8d being obviously identical to that of the voltage applied to main electrodes 3 and 4, and the thickness of plate 2 being constant, the frequency of the auxiliary vibration is identical to the frequency of the main vibration.

However, as each auxiliary electrode 7f and 8d is located on the surface of plate 2 opposite the surface where the main electrode to which it is connected, respectively 3 and 4, is fitted, the electric field generated by auxiliary electrodes 7f and 8d in area 9 is always in a direction opposite to that generated by main electrodes 3 and 4. As a result, the auxiliary vibration and the main vibration are in opposition of phase.

The auxiliary vibration is propagated into resonator 1 from zone 9 and superposes itself on the main vibration which is propagated from the zone of electrodes 3 and 4.

These two vibrations being in opposition of phase, the amplitude of the vibration resulting from their superposition is lower than the highest of the two amplitudes considered separately.

In the part of resonator 1 located between zone 9 and the zone of terminals 5 and 6, the main and auxiliary vibrations are both propagated in the same direction and weaken according to the same exponential law. The vibration resulting from their superposition thus has, in the zone of terminals 5 and 6, a very low residual amplitude and the mechanical energy dissipated in the fastening of the resonator is also very low.

The presence of auxiliary electrodes 7f and 8d, which create in zone 9 of plate 2 an auxiliary vibration in opposition of phase with respect to the main vibration generated by electrodes 3 and 4 thus enables the amount of mechanical energy dissipated in the fastening of the resonator to be greatly decreased and a notable increase in its quality factor compared to that of a conventional resonator having no such auxiliary electrodes.

The shape and the dimensions of these auxiliary electrodes, which determine those of zone 9, are not very critical. Tests have shown that, for a resonator designed to vibrate at a frequency of 10 MHz, having a total length of 6 mm and a total width of 2 mm, the presence of auxiliary electrodes such as electrodes 7f and 8d covering an area ranging between 1 and 3% of the area of the main electrodes, such as electrodes 3 and 4, and distant approximately 1 mm from these, causes the quality factor of the resonator to increase 1.5 to 2 times compared to the quality factor of a resonator having the same dimensions but not provided with the auxiliary electrodes.

The FIGURE also shows a modification of the resonator according to the invention. In this modification, an aperture 10, shown in chain-dotted lines, is located between auxiliary electrodes 7f and 8d and terminals 5 and 6 and extends through the entire thickness of plate 2.

It has been found that the presence of aperture 10 further increases the quality factor of resonator 1 compared to a similar resonator having no such aperture.

This may possibly be due to the fact that aperture 10 restricts the propagation of the vibration which results from the superposition of the main and auxiliary vibrations towards terminals 5 and 6. Part of the resulting vibration is reflected towards the auxiliary and main electrodes due to the discontinuity in the acoustic impedance of the resonator created by aperture 10. The mechanical energy of the resulting vibration thus reflected therefore remains "trapped" in the zone of the electrodes, where it helps to keep the resonator vibrating, and the amount of energy dissipated wastefully in the fastening of the resonator to its support is further decreased.

Aperture 10 can be variously shaped, e.g. as the slot parallel to the length of plate 2 shown in the FIGURE. This slot can be closed at both ends, as shown in the FIGURE. It can also be open at its end nearest terminals 5 and 6. This possibility is not illustrated.

The dimensions of aperture 10 are not very critical either. Tests have shown that an aperture 10 measuring 0.5 to 1.5 mm along the length of plate 2 and 0.2 to 0.5 mm widthwise of the plate, made in a resonator having the same dimensions as the resonator described above, causes the quality factor of the resonator to increase 1.5 to 2 times compared to the quality factor of a similar resonator having no such aperture.

The invention is of course not limited to the form of embodiment and its modification described with reference to the FIGURE. For example, the shape of plate 2 and/or of main electrodes 3 and 4 could differ from that shown in the FIGURE. Similarly, auxiliary electrodes 7f and 8d, which are merely parts of conductors 7 and 8 in the FIGURE, could be diffently shaped from those shown and, in particular, could be wider or narrower than conductors 7 and 8. Furthermore, connection terminals 5 and 6 could each be provided on one of the principal surfaces of plate 2. As a result, the arrangement of conductors 7 and 8 would be different. Finally in the example described and illustrated, electric connection terminals 5 and 6 of resonator 1 also serve to fasten it mechanically to its support. The resonator could also be provided with mechanical fastening means separate from the electric connection means. All these modifications would not cause the resonator to which they are applied to be outside the scope of the invention.

It should also be noted that the presence of electrodes for exciting an auxiliary vibration such as electrodes 7f and 8d and/or of an aperture such as aperture 10 in no way complicates the manufacture of resonators according to the invention. Known resonators are often mass-produced by means of methods involving the deposition of metallic layers and etchings through screens, these methods being known and not described here. Resonators according to the invention can be manufactured using exactly the same methods. The auxiliary electrodes such as electrodes 7f and 8d in the FIGURE can be deposited at the same time as the other metallic parts of the resonator, and the apertures such as aperture 10 in the FIGURE can be etched while cutting the plates such as plate 2. The improvement in the characteristics of resonators provided by aperture 10 and by auxiliary electrodes 7f and 8d can thus be achieved without any increase in cost price.

I claim:

1. A resonator adapted to vibrate in a thickness-shear mode and including a plate of piezo-electric material and plate vibrating means, said plate having a zone for fastening the resonator mechanically to a support and said plate vibrating means comprising a first electrode on a first surface of the plate, a second electrode on a second surface of the plate opposite the first electrode, means for connecting the first and second electrodes electrically to different potentials of an oscillator circuit to provide a main electric field between the first and second electrodes for generating a main vibration of said plate and including a first terminal on said plate connected to said first electrode by a first conductor and a second terminal on said plate connected to said second electrode by a second conductor, a third electrode connected electrically to the first electrode and disposed on the second surface of the plate between the second electrode and the mechanical fastening zone, and a fourth electrode connected electrically to the second electrode and disposed opposite the third electrode on the first surface of the plate, said third and fourth electrodes being arranged to provide therebetween an auxiliary electric field in a direction opposite to said main electric field for generating an auxiliary vibration of said plate in opposition of phase with respect to said main vibration generated by said main electric field for decreasing the amplitude of the vibration of the plate in said mechanical fastening zone.

2. The resonator of claim 1, further comprising an aperture extending through the thickness of said plate between said mechanical fastening zone and said first and second electrodes to restrict said vibrations from propagating towards said mechanical fastening zone.

3. The resonator of claim 2, wherein said plate is of generally oblong rectangular shape when viewed in a plan view, said first and second electrodes being arranged substantially at one end of the plate and said mechanical fastening zone being arranged substantially at the other end of the plate, and wherein said aperture is formed by an elongated slot extending substantially lengthwise of the plate.

4. The resonator of claim 3, wherein said slot is closed at both ends.

5. The resonator of claim 3, wherein said slot is open at its end nearest said mechanical fastening zone.

6. The resonator of claim 2, wherein said third electrode comprises a segment of said first conductor disposed on the second surface of said plate and said fourth electrode comprises a segment of said second conductor disposed on the first surface of said plate, said segments crossing each other in a zone disposed between said first and second electrodes and said mechanical fastening zone.

7. The resonator of claim 6, wherein said first and second terminals are in said mechanical fastening zone.

8. The resonator of claim 7, wherein said first and second terminals are on the same surface of said plate.

* * * * *